United States Patent
Nozawa et al.

(10) Patent No.: US 6,720,587 B2
(45) Date of Patent: Apr. 13, 2004

(54) STRUCTURE EVALUATION METHOD, METHOD FOR MANUFACTURING SEMICONDUCTOR DEVICES, AND RECORDING MEDIUM

(75) Inventors: Katsuya Nozawa, Osaka (JP); Tohru Saitoh, Settsu (JP); Minoru Kubo, Nabari (JP); Yoshihiko Kanzawa, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 12 days.

(21) Appl. No.: 10/048,562

(22) PCT Filed: Jun. 15, 2001

(86) PCT No.: PCT/JP01/05161

§ 371 (c)(1),
(2), (4) Date: Feb. 4, 2002

(87) PCT Pub. No.: WO01/97267

PCT Pub. Date: Dec. 20, 2001

(65) Prior Publication Data

US 2002/0106819 A1 Aug. 8, 2002

(30) Foreign Application Priority Data

Jun. 16, 2000 (JP) ......................................... 2000-181097

(51) Int. Cl.⁷ .......................................... H01L 31/109
(52) U.S. Cl. .................................................... 257/184
(58) Field of Search ........................... 369/712; 349/62, 349/123, 119; 428/1.25; 256/184; 117/8

(56) References Cited

U.S. PATENT DOCUMENTS 6,037,614 A * 3/2000 He et al. .................... 257/184
6,093,243 A * 7/2000 Okada et al. ................... 117/8

FOREIGN PATENT DOCUMENTS

| JP | 03-082017 | 4/1991 |
| JP | 05-234918 | 9/1993 |
| JP | 05-238880 | 9/1993 |
| JP | 05-291143 | 11/1993 |
| JP | 05-308053 | 11/1993 |
| JP | 08-055145 | 2/1996 |
| JP | 10-300432 | 11/1998 |
| JP | 11-316187 | 11/1999 |

OTHER PUBLICATIONS

International Search Report, Application No. PCT/US01/05161, Mailing Date: Sep. 25, 2002.

* cited by examiner

*Primary Examiner*—John F. Niebling
*Assistant Examiner*—Andre' C. Stevenson
(74) *Attorney, Agent, or Firm*—McDermott, Will & Emery

(57) ABSTRACT

An initial estimated value of a process condition is set, and a structure of an element of a semiconductor device is estimated by a process simulator, after which an estimated value of a physical amount measurement value is calculated. Then, an actual measurement value of a physical amount of the element of the semiconductor device, which is obtained by an optical evaluation method, and a theoretical calculated value thereof are compared with each other, so as to obtain a probable structure of the measured semiconductor device element by using, for example, a simulated annealing, or the like. A process condition in a process for other semiconductor device elements can be corrected by using the results.

4 Claims, 11 Drawing Sheets

STRUCTURE EVALUATION METHOD, METHOD FOR MANUFACTURING SEMICONDUCTOR DEVICES, AND RECORDING MEDIUM

TECHNICAL FIELD

The present invention relates to a structure evaluation method used in the management of a manufacturing process of semiconductor device elements, a method for manufacturing a semiconductor device, and a recording medium.

BACKGROUND ART

In recent years, a process of forming a thin film such as an oxide film, a nitride film, or a polysilicon film, on a substrate is often used in manufacturing semiconductor devices. In order to produce a device using these thin films as elements and obtain desirable characteristics, the thickness and the physical properties of each thin film need to fall within predetermined ranges, respectively. Typically, the physical properties and the thickness of a thin film vary depending on the conditions of the process of forming the thin film (hereinafter "thin film process") and the time period for which the process is performed. Therefore, after a thin film process is performed, it is evaluated as to whether the formed thin film has the predetermined thickness and physical properties. In the mass production of the device, it is necessary to change the process conditions when it is found from the evaluation results that the formed thin film does not have the desirable thickness and physical properties.

In a conventional thin film process, a thin film formed in a single process is basically a substantially homogeneous film whose composition and other physical properties do not substantially vary in the depth direction. On the other hand, it is often the case that a polysilicon film to be a gate electrode is deposited on a silicon oxide film to be a gate insulating film, as in the case of the gate section of an Si-MOS transistor. In most of such cases, the composition is substantially uniform within each layer with a well-defined interface between layers.

An optical evaluation method is a technique for evaluating the thickness and composition of a single-layer film or each layer of a multi-layer film on the substrate. As examples of the optical evaluation method, a spectroscopic ellipsometry method and a spectroscopic reflectance measuring method are widely used.

The spectroscopic reflectance measuring method is an evaluation method in which a sample is irradiated with light so as to obtain, for each of the separated wavelength regions, the ratio (reflectance) between the intensity of light that is used for irradiating the sample and the intensity of light that is reflected from the sample.

The spectroscopic ellipsometry method is an evaluation technique in which a sample is irradiated with linearly-polarized light so as to obtain information on the sample from the change in the polarization of the reflected light. Where a component of the linearly-polarized light whose electric field vector is parallel to the incident plane is denoted as a p-polarization component, another component whose electric field vector is perpendicular to the incident plane is denoted as an s-polarization component, and their complex reflectances are denoted by Rp and Rs, respectively, $\rho = Rp/Rs$ is also a complex number. Therefore, $\rho$ can be expressed as $\rho = \tan\Psi\, e^{i\Delta}$ using two real numbers $\Psi$ and $\Delta$. The spectroscopic ellipsometry method is used to measure the two physical amounts $\Psi$ and $\Delta$ for each wavelength of light so as to obtain a spectrum.

A common nature of these optical evaluation methods is that since the phase and/or reflectance of light vary depending on the combination of the optical constants (refractive index n, extinction coefficient k) of the substance through which light passes, the measurement results include information on the optical constants of the substance. Moreover, since the light interference effects are significantly expressed in the optical information taken from the measurement object, the measurement results are often varied substantially by the thickness of the thin film, etc., whereby it is possible to obtain information on the thickness of the thin film, etc., with any of these evaluation methods.

However, the physical amount measured by the reflectance measuring method or the spectroscopic ellipsometry method (the reflectance in the case of the reflectance measuring method, and $\Psi$ and $\Delta$ in the case of the spectroscopic ellipsometry method) includes the influences of all substances that are present in the path of light, and those influences cannot directly be extracted as separated information.

Therefore, when the spectroscopic reflectance measuring method or the spectroscopic ellipsometry method is used to measure a sample so as to evaluate the thickness and physical properties of a thin film, it is necessary to go through a procedure of comparing the actual measurement value with the estimated value of the measurement value, as follows.

FIG. 10 is a flow chart illustrating a management procedure for a conventional sample evaluation and thin film manufacturing process.

First, in step ST201, a sample A that has been produced by a process P is measured by an evaluation method M so as to obtain actual measurement values of a physical amount (e.g., $\Delta$, $\Psi$).

On the other hand, a geometric model of the sample structure is set in step ST202, and an initial estimated value that defines the sample structure is set in step ST203, after which a theoretical estimated value of a physical amount measurement value is calculated in step ST204. Thus, in a case where an optical evaluation is used, the structure of a measurement sample (n and k profiles) is assumed, and the theoretical estimated value of the physical amount measurement value, which would be obtained if the n and k profiles were evaluated with the evaluation method M, is calculated.

Then, in step ST205, the actual measurement value of the physical amount and the theoretical estimated value are compared with each other. In this step, an evaluation value for evaluating the degree of difference between the actual measurement value and the theoretical estimated value is defined.

Then, in step ST206, it is determined whether the evaluation value is a local minimum value. If the evaluation value is not a local minimum, a new estimated value is set in step ST207, and then the process returns to the operation of step ST204 to repeat the operations of steps ST204 to ST206.

Then, if it is determined in the determination of step ST206 that the evaluation value is a local minimum, the process proceeds to step ST208 to decide on the estimated value of the sample structure, after which it is determined whether the sample structure is within an appropriate range in step ST209. If it is determined as a result of the determination that the sample structure is within the appropriate range, the process proceeds to step ST210 to perform the next operation with the process conditions that have been set.

On the other hand, if it is determined as a result of the determination in step ST209 that the sample structure is not within the appropriate range, the process proceeds to step ST211 to determine whether the geometric model of the sample structure is appropriate. If the geometric model of the sample structure is appropriate, the process proceeds to step ST212 to estimate the cause of the abnormal structure so as to take countermeasures such as changing the temperature, the time, the gas flow rate, etc.

If it is determined as a result of the determination in step ST211 that the geometric model of the sample structure is not appropriate, the process proceeds to ST213 to set a new geometric model, after which the process returns to step ST203 to repeat the operations of step ST203 and the subsequent steps.

As the evaluation value used in step ST205, a function which is normally a positive real number, which decreases as the difference between the actual measurement value and the theoretical estimated value decreases, and which becomes 0 when they are completely equal to each other, is used. Generally, it is often the case that a variance value $\sigma$ expressed by Expression (1) below:

$$\sigma = \Sigma \{aj(Sj - Smodj)^2\} \qquad (1)$$

Which is obtained by adding together the squares of the differences between the actual measurement value and the theoretical estimated value for all wavelengths, is used as the evaluation value. Herein, Sj is the actual measurement value of the physical amount, and Smodj is the theoretical estimated value of the physical amount. Moreover, aj is a weighting coefficient, and information for various wavelengths are equally used for evaluation when all the weighting coefficients aj are 1. However, there are cases where the value of the weighting coefficient aj is set to other than 1 so that a wavelength at which the feature of the sample structure is likely to appear has a greater contribution.

With the least square method, an assumed sample structure for which the evaluation value is minimized is used as the measurement value. Thus, a sample structure (n and k profiles in the depth direction) that gives the same values $\Psi$ and $\Delta$ as those of the actual measurement is sought for, and the sample structure that gives the closest values $\Psi$ and $\Delta$ is used as the measurement value. However, with the spectroscopic ellipsometry method, the $\Psi$ and $\Delta$ measurement results are varied by slight variations in the sample, e.g., variations in the optical constants on the surface atomic layer level. Thus, it is not possible to calculate the theoretical estimated value for every possible sample structure and compare it with the actual measurement value.

Therefore, in an actual evaluation, the sample structure is expressed by a small number of parameters so as to obtain, within an assumed range of values, the combination of parameter values for which the evaluation value is a local minimum. Moreover, while the evaluation value is a function of these parameters, the function is typically complicated, and it is practically very difficult to obtain the minimum value. In view of this, a local minimum value is used instead of a minimum value. A local minimum value can be obtained by algorithms such as a simulated annealing. With these algorithms, an arbitrary initial value is given to a parameter, and a slight variation is given to the parameter value in a direction such that the evaluation value decreases, so as to obtain a point where any slight variation would increase the evaluation value, i.e., the local minimum point. However, in the case of the method using the local minimum point, the obtained local minimum point may not be the point that gives the minimum value.

With a layered structure of single-composition films with well-defined interfaces, which is formed by a conventional thin film process, the thin film can be evaluated with a relatively good reproducibility with the method described above. This is because the structure that can be formed by such a process is simple, whereby the thin film structure can be expressed by a relatively small number of parameters, and because a local minimum point of the evaluation value is unlikely to occur, other than that for the combination of parameter values that gives a thin film model structure closest to the actual thin film structure.

Next, application of the conventional optical evaluation method described above to the evaluation of the thickness or characteristics of a crystal film containing a plurality of elements will be discussed.

In recent years, the epitaxial growth technique for crystal layers, which is by nature different from the conventional thin film process, has been used primarily for the production of an HBT (heterojunction bipolar transistor), or the like. The epitaxial growth technique is a technique of growing, on a crystal serving as an underlying base, such as a substrate, a new crystal having a structure that is in conformity with the structure of the atoms forming the underlying crystal. With this technique, the thickness can be controlled with a very high precision (typically about 1 nm, and even a single-atom layer under special conditions). Moreover, when the crystal to be grown is made of a material, such as SiGe, that forms a mixed crystal over a wide composition percentage range, it is possible to control the composition percentage. Therefore, utilizing these characteristics, it is possible to realize a state in which the composition varies approximately continuously in the depth direction with any profile. An example of a device utilizing this characteristic is a composition-graded SiGe-HBT. In the case of a composition-graded SiGe-HBT, the Ge composition is 0 in the emitter region and the Ge composition is gradually increased in the base region. As the Ge composition percentage increases, the band gap is narrowed, thereby generating an electric field in a direction of accelerating the carrier therein. As a result, the base transit time of the carrier is shortened, enabling a high speed operation of the transistor.

In such an SiGe composition-graded HBT, the composition is sometimes kept varying in the base region so as to provide a triangular profile. Typically, however, it is often the case that a trapezoidal profile with the addition of a buffer layer having a uniform Ge composition percentage is employed.

FIG. 11(a) is a diagram illustrating a Ge composition percentage profile in the depth direction of a layered structure that is formed by depositing an SiGe composition-graded layer and an Si cap layer on an SiGe buffer layer having a uniform composition.

As described above, those in the art have started to produce a structure whose composition varies approximately continuously by using the epitaxial growth technique. Accordingly, there has been a need for a method for evaluating a profile that varies approximately continuously while making a correction when the profile is deviated from a predetermined range.

In view of this, attempts have been made to evaluate a sample whose composition varies approximately continuously in the depth direction by using the spectroscopic ellipsometry method. In the evaluation process with the spectroscopic ellipsometry method, it is possible to measure $\Psi$ and $\Delta$ with a sample having any composition profile. Moreover, it is possible to calculate the theoretical estimated values of Ψ and Δ by approximating a composition profile that varies approximately continuously to a sufficiently thin layered film.

Problems to be Solved

However, there have been problems as follows in forming a mixed crystal including a plurality of elements, such as an SiGe film, through epitaxial growth.

For an SiGe epitaxial growth film in which the Ge composition percentage can be varied on the atomic layer level toward the depth direction, unlike a thin film having a uniform composition, the number of sample structures that can possibly be taken increases significantly. Nevertheless, as long as the process conditions, that have been set, are accurately realized, the resulting thin film structure should substantially coincide with the intended thin film structure.

However, it was found when a crystal was grown intending to produce a thin film having a trapezoidal composition-graded profile, as illustrated in FIG. 11(a), for example, that the resulting thin film does not have an accurately trapezoidal composition profile if the crystal is grown at a temperature different from the set temperature.

It is believed that this is because the crystal growth rate depends on the substrate temperature and the dependence varies with the Ge composition percentage. If the Ge composition percentage in an SiGe crystal being grown increases during the growth of an SiGe film, the activation energy in the crystal growth decreases, whereby the change in the growth rate with respect to the change in the substrate temperature becomes small with respect to Si. As a result, if a crystal is grown under conditions such that the Ge composition percentage has a trapezoidal profile at a reference temperature, the Ge composition percentage of a composition-graded SiGe crystal that has been grown at a temperature higher than the reference temperature has a downwardly protruding profile, while the Ge composition percentage of a composition-graded SiGe crystal that has been grown at a temperature lower than the reference temperature has an upwardly protruding profile.

FIG. 11(b) is a diagram illustrating a Ge composition percentage profile in the depth direction of a layered structure having a composition-graded SiGe film grown at a temperature higher than the reference temperature.

FIG. 11(c) is a diagram illustrating a Ge composition percentage profile of a layered film having a Ge composition percentage profile as illustrated in FIG. 11(b), but with trapezoidal approximation. Specifically, when the structure of a layered film having a Ge composition percentage profile as illustrated in FIG. 11(b) is fit to a trapezoidal model employing the thickness of each layer and the Ge composition percentage as parameters, by using the spectroscopic ellipsometry method, a curve portion of the actual profile cannot be expressed, thereby obtaining, as the estimated value, a structure where the total thickness is substantially equal to the actual profile but the shape of an inclined portion is different from the actual shape. As a result, it is determined that the thicknesses of the Si cap and the SiGe buffer layer are thinner than they actually are, while determining that the thickness of the SiGe composition-graded layer is much thicker than it actually is, whereby it is erroneously determined that the growth time is longer than it actually is.

There is no geometric model that conveniently describes a Ge composition percentage profile as illustrated in FIG. 11(b). Therefore, in a conventional method for correcting the process conditions, a method of simply correcting the growth time of each layer of the layered film is used.

FIG. 11(d) is a diagram illustrating a Ge composition percentage profile in the depth direction of a layered film that is formed by correcting the thickness of each layer of the layered film by shortening the growth time based on the results of a trapezoidal approximation. As illustrated in the figure, when the process conditions are corrected by using, as the estimated value, the profile of the layered film obtained by the trapezoidal approximation as illustrated in FIG. 11(c), it is determined that the SiGe composition-graded layer is evaluated to be thicker than it actually is and thus this is corrected, thereby forming a layered film having an SiGe composition-graded layer that is thinner than the design value.

Thus, with the correction method used in the prior art, the Ge profile cannot be expressed appropriately with a geometric model, and thus cannot be evaluated correctly, thereby making an erroneous correction.

As described above, it is only a film that is grown at the reference temperature whose Ge composition percentage profile structure can be expressed by a trapezoid that is defined by the four parameters, i.e., the thicknesses of the Si cap layer, the composition-graded layer and the SiGe buffer layer, and the Ge composition percentage of the layers, as illustrated in FIG. 11(a). Therefore, even if the growth conditions are corrected based on the actual measurement value of the thickness of the grown SiGe film, etc., it is difficult to make an accurate correction as long as it is made on the assumption that the Ge composition percentage profile is always trapezoidal.

In view of this, the Ge composition percentage profile can be expressed at any temperature by increasing the number of parameters defining the Ge composition percentage profile of the film and expressing the Ge composition percentage profile with a polygon having more apexes than a trapezoid. However, when the number of parameters defining the Ge composition percentage profile is increased, the number of combinations of parameters that give a local minimum value of the variance value x described above increases significantly, whereby it is difficult to obtain a correct estimated value with a practical amount of calculation. Theoretically, if the number of parameters defining a geometric model structure such as a Ge composition percentage profile is increased, it is of course possible to express a sample structure closer to the actual structure. However, when the number of parameters is increased, there may be more than one combinations of parameter values that give a local minimum value of the evaluation value. As a result, the measurement results may be varied significantly for substantially the same sample structures by subtle variations in the Ψ and Δ measurements due to noise introduced in a measurement using the spectroscopic ellipsometry method, or a subtle difference in the sample structures such as a structure that is not included in the structure model, e.g., composition fluctuations at an interface.

DISCLOSURE OF THE INVENTION

An object of the present invention is to provide a structure evaluation method, a method for manufacturing a semiconductor device, and a recording medium, for grasping a process condition from a measurement value of a sample via a sample structure and correcting the process condition using the results so as to obtain a structure that is substantially as designed.

A structure evaluation method of the present invention includes the steps of: (a) obtaining a plurality of actual measurement values of a physical amount of an element of a semiconductor device by an optical evaluation method; (b) assuming a process condition for forming the element, and obtaining through calculation a structure of the element that is formed through a process using the assumed process condition; (c) calculating estimated values of a plurality of measurement values of a physical amount that are obtained when evaluating the structure of the element, which has been obtained in the step (b), by the optical evaluation method; and (d) estimating the structure of the element based on the plurality of actual measurement values of the physical amount of the element and the estimated values of the plurality of measurement values.

With this method, the most probable structure of the element is estimated in the step (d) based on the estimated value of the measurement value of the physical amount of the element based on the structure of the element that can actually be taken, which is obtained in the step (b), and the actual measurement value of the physical amount. Thus, unlike the conventional structure evaluation, which assumes a uniform structure, it is possible to perform an accurate structure evaluation that reflects the structure of the physical amount that varies as the process condition varies.

A numerical value for evaluating a difference between the plurality of actual measurement values of the physical amount and the estimated values of the plurality of measurement values is calculated in the step (d), so that the structure of the element is estimated through the steps (b) and (c) until the value is less than or equal to a threshold value. In this way, the structure evaluation can be facilitated by utilizing an algorithm such as a simulated annealing that utilizes the least square method, for example.

In the step (b), the calculation is performed by using a process simulator. In this way, it is possible to perform a structure evaluation conveniently and quickly.

Elements are formed in advance by processes using a plurality of process conditions and structures of the elements are obtained by the optical evaluation method so as to create a database of correlations between the plurality of process conditions and the structures of the elements formed by the process conditions; and in the step (b), the structure of the element is obtained through calculation based on the correlations. In this way, it is possible to perform a structure evaluation conveniently and quickly.

Significant effects can be provided by using the structure evaluation method of the present invention in a case where the process is an epitaxial growth process of a crystal film, and particularly in a case where the crystal film is a crystal film containing a plurality of elements.

In a case where the crystal film is a crystal film including a structure which contains Si and Ge and whose band gap varies in a graded manner, it is possible to perform a structure evaluation that can be used for controlling the Ge composition percentage profile. Specifically, even if the Ge composition percentage profile does not take a graded structure as designed due to the crystal growth rate being varied according to the Ge composition percentage, a Ge composition percentage profile that can actually occur is calculated as an estimated value of the measurement value of the physical amount, whereby it is possible to obtain an accurate Ge composition percentage profile in a crystal film for which actual measurement values have been obtained, by utilizing the estimated value of the measurement value of the physical amount.

It is preferred that the optical evaluation method is either a spectroscopic ellipsometry method or a spectroscopic reflectance measuring method.

A method for manufacturing a semiconductor device of the present invention includes the steps of: (a) obtaining a plurality of actual measurement values of a physical amount of an element of a semiconductor device by an optical evaluation method for one evaluation wafer of a plurality of wafers each including the element; (b) assuming a process condition for forming the element of the evaluation wafer, and obtaining through calculation a structure of the element that is formed through a process using the assumed process condition; (c) calculating estimated values of a plurality of measurement values of a physical amount that are obtained when evaluating the structure of the element, which has been obtained in the step (b), by the optical evaluation method; (d) estimating the structure of the element based on the plurality of actual measurement values of the physical amount of the element of the evaluation wafer and the estimated values of the plurality of measurement values; and (e) determining whether or not to correct the process condition of the process at least for wafers of the plurality of wafers other than the evaluation wafer based on a difference between the estimated structure of the element of the evaluation wafer and a designed structure of the plurality of wafers.

With this method, it is possible to change/set the process condition for the other wafers after accurately grasping the structure of the element of the evaluation wafer by using the structure evaluation method described above, whereby it is possible to improve the characteristics of a semiconductor device and to reduce the variations in the characteristics thereof.

Significant effects can be provided by using the method for manufacturing a semiconductor device of the present invention in a case where the process is an epitaxial growth process of a crystal film, and particularly in a case where the crystal film is a crystal film containing a plurality of elements.

In a case where the crystal film is a crystal film including a structure which contains Si and Ge and whose band gap varies in a graded manner, it is possible to accurately control the Ge composition percentage profile. Specifically, even if the Ge composition percentage profile does not take a graded structure as designed due to the crystal growth rate being varied according to the Ge composition percentage, a Ge composition percentage profile that can actually occur is calculated as an estimated value of the measurement value of the physical amount, whereby it is possible to obtain an accurate Ge composition percentage profile in a crystal film for which actual measurement values have been obtained, by utilizing the estimated value of the measurement value of the physical amount.

A recording medium of the present invention is a recording medium that can be taken into a computer used for performing a characteristic evaluation of an element of a semiconductor device by an optical evaluation method, the recording medium being a computer-readable recording medium storing therein a program for instructing the computer to execute the procedures of: (a) taking a plurality of actual measurement values of a physical amount of the element of the semiconductor device; (b) assuming a process condition for forming the element, and obtaining through calculation a structure of the element that is formed through a process using the assumed process condition; (c) calculating estimated values of a plurality of measurement values of a physical amount that are obtained when evaluating the structure of the element, which has been obtained in the procedure (b), by the optical evaluation method; and (d) estimating the structure of the element based on the plurality of actual measurement values of the physical amount of the element and the estimated values of the plurality of measurement values.

In this way, it is possible to automatically perform the structure evaluation by using a computer.

It is preferred that a numerical value for evaluating a difference between the plurality of actual measurement values of the physical amount and the estimated values of the plurality of measurement values is calculated in the procedure (d), so that the structure of the element is estimated through the procedures (b) and (c) until the value is less than or equal to a threshold value.

BEST MODE FOR CARRYING OUT THE INVENTION

Figure 1:
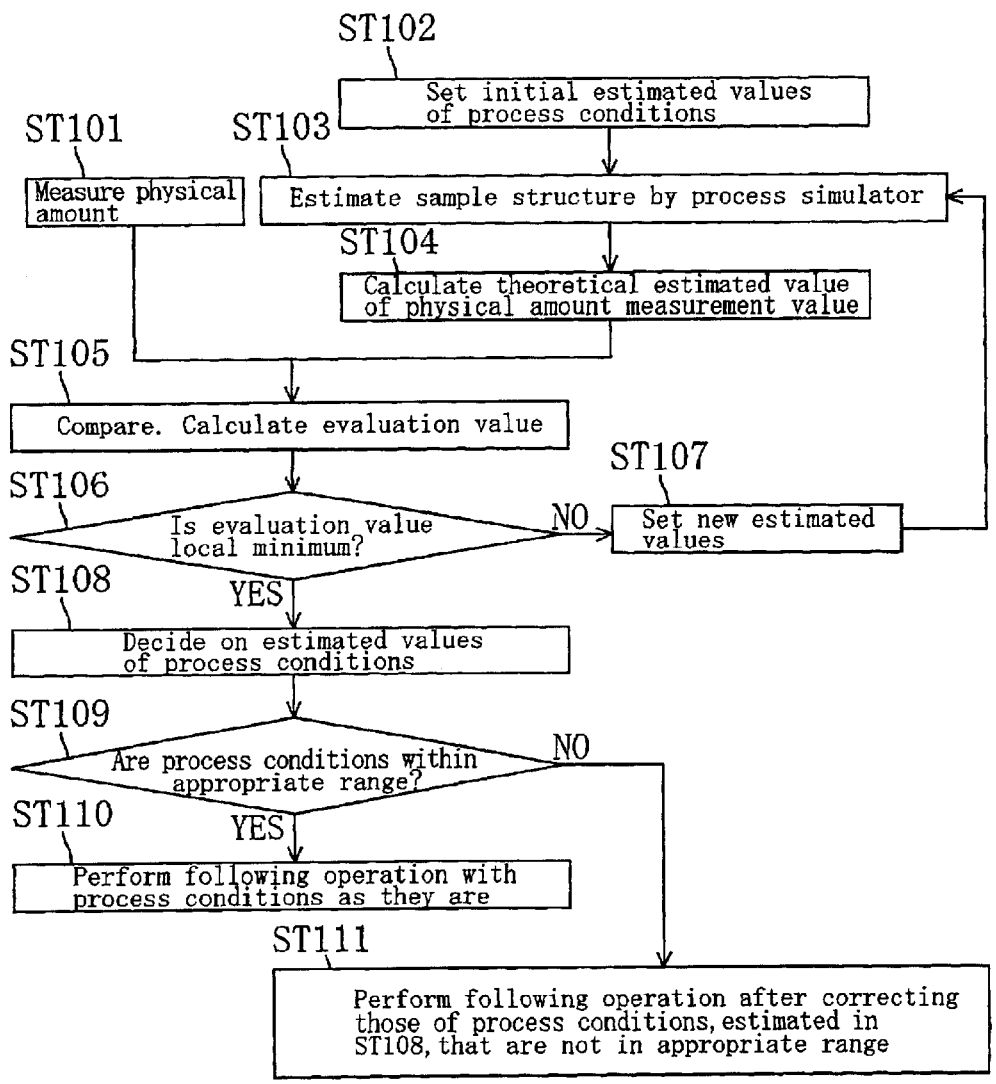
FIG. 1 is a flow chart illustrating a management procedure for a sample evaluation and thin film manufacturing process according to an embodiment of the present invention.

Basic Concept of Structure Evaluation Method of The Present Invention

The present embodiment uses a process simulator for calculating the profile of an actually-produced Ge composition percentage from the process conditions. Therefore, it is necessary to clarify the relationship among the process conditions, the growth rate and the Ge composition percentage in an SiGe layer. Herein, a case of a process of epitaxially growing a crystal by a UHV-CVD method (ultra high vacuum chemical vapor deposition method) will be described as an example.

The epitaxial growth technique is a technique of growing a new crystal on the surface of an existing crystal. Particularly, the UHV-CVD method used in the present embodiment is a type of epitaxial growth process in which the degree of vacuum in the crystal growth apparatus is increased to about $10^{-6}$ Pa to $10^{-7}$ Pa, after which a material gas is introduced into the crystal growth apparatus so as to grow a crystal through a chemical reaction between the heated substrate surface and the material gas.

In the crystal growth, silicon can be grown when a gas containing silicon such as silane ($SiH_4$) or disilane ($Si_2H_6$) is used as the material gas. When a gas containing germanium such as germane ($GeH_4$) is introduced into the crystal growth apparatus along with the gas containing silicon, an SiGe crystal, which is a mixed crystal of silicon and germanium can be grown. When a gas containing carbon such as $SiH_3CH_3$ is introduced into the crystal growth apparatus along with gas containing silicon and the gas containing germanium, an SiGeC crystal can be grown.

In the case of the SiGe crystal, the ratio among elements contained in the mixed crystal (the composition percentage) can take any value in principle. The composition percentage among elements of the SiGe crystal is determined by the process conditions used when growing the crystal. In the case of the UHV-CVD method, the composition percentage is determined only by the partial pressure of the silicon source gas and the partial pressure ratio of the germanium source gas in the crystal growth apparatus without substantially depending on the substrate temperature or the pressure (total pressure) in the crystal growth apparatus.

Normally, a crystal portion that has been once grown does not change until a process other than crystal growth, such as a high temperature heat treatment, is performed subsequently. For example, if an SiGe layer is first grown by simultaneously introducing disilane and germane into the crystal growth apparatus, after which an Si layer is grown by introducing only disilane, it is possible to form a double-layer film including the SiGe layer and the Si layer on the substrate surface. If the flow rate ratio between disilane and germane is varied approximately continuously over time, it is possible to produce an SiGe layer whose Ge composition percentage varies approximately continuously in the depth direction. Thus, the Ge composition percentage profile of a film that has been grown by an epitaxial growth process is determined, just like a tree ring, by the history of process conditions under which each layer has been grown. Therefore, in order to obtain a desired composition percentage profile, it is necessary to vary the growth conditions approximately continuously from the start to the end of the crystal growth.

The composition percentage at a certain depth of an epitaxially grown film is determined by the source gas partial pressure ratio as of the time when the portion of the film at that depth is being grown. However, a gas flow rate ratio of what time corresponds to the portion of the film at that depth cannot be grasped unless it is known to what thickness the film has been grown before the portion at that depth is grown.

In an SiGe film, the Ge composition ratio x (d) in a portion of the film at a distance of d from an origin, the origin being the original substrate surface, is expressed by Expression (2) below:

$$x(d) = Cm\{P_{si}(t(d)), P_{Ge}(t(d)), T(d))\} \quad (2)$$

Where t(d) denotes the time at which the portion of the crystal is grown. Note that Cm is a function representing the relationship among the disilane partial pressure $P_{Si}$, the germane partial pressure $P_{Ge}$, the substrate temperature T, and the composition ratio.

The variable t(d) in Expression (2) can be obtained by Expression (3) below:

$$d(t) = \int (\tau=0 \text{ to } t) gr\{P_{si}(\tau), P_{Ge}(\tau), T(\tau)\} d\tau \quad (3)$$

With the crystal growth start time t being 0. Note that gr is a function representing the relationship among the gas partial pressure, the substrate temperature and the growth rate.

Therefore, the value x(d) defining the profile of the Ge composition ratio (composition percentage) in the depth direction can be obtained if the functions Cm and gr are known, while the partial pressures of disilane and germane and the substrate temperature at any time from the start to the end of the crystal growth are known. Thus, the sample structure can be estimated from the process conditions. Note that Relational Expressions (2) and (3) can be concretely obtained by producing samples while varying the growth conditions.

Relational Expressions (2) and (3) can be replaced by those of higher precisions by accumulating information on the growth mechanism, etc. Moreover, as for the structure, it is only necessary to realize a level of precision that is required for evaluating a particular structure such as the Ge composition percentage profile, for example, not for evaluating all the structures of the element of interest. Therefore, approximated expressions that are simpler than Expressions (2) and (3) can be used.

While x(d) can be obtained analytically from $P_{si}(\tau)$, $P_{Ge}(\tau)$ and $T(\tau)$ by solving simultaneous equations using Expressions (2) and (3) above, it may be possible that there is no solution because Expressions (2) and (3) are, by themselves, complicated.

In view of this, an arithmetic approach of obtaining the value of each variable from Relational Expressions (2) and (3) can be taken, and it is more convenient to take the arithmetic approach. If an analytical approach is taken, it is possible to calculate the composition ratio (composition percentage) of a film at any depth. From a practical point of view, however, it is only necessary to obtain the profile of the composition in the depth direction at a level of precision that is required for obtaining reliable estimated values during the process of calculating the theoretical estimated values of $\Delta$ and $\Psi$ spectra, which are obtained by using the spectroscopic ellipsometry method from the profile of the composition in the depth direction.

In order to simplify the calculation, the crystal growth process from the start to the end thereof can be regarded as a series of basic steps in each of which it is possible to regard that the growth conditions do not vary, and the gas pressure and the substrate temperature in each step and the time length of each step can be given, thereby obtaining the composition and the thickness (in this case it is simply the product of the amount of time and the growth rate of the step) of the film that has been grown in each step from the relational expressions of the functions Cm and gr, and thus obtaining the composition profile.

In practice, when a film having a profile in which the composition varies approximately continuously, such as an HBT structure having an SiGe composition-graded layer, is epitaxially grown, it is difficult to actually vary the partial pressure of a source gas approximately continuously. Therefore, it is mostly the case where a method in which the gas partial pressure is varied in short steps is employed. In such a case, it can be regarded that the process conditions are normally constant in each step. Therefore, it is more practical to employ a method in which the composition and the growth rate/thickness are calculated for each step.

As described above, a sample structure can be estimated once the process conditions (the gas partial pressure, the substrate temperature) from the start to the end of the crystal layer growth are known. A program for estimating a sample structure from process conditions as described above is generally called a "process simulator". Also in the present specification, "process simulator" is used to mean such a program.

Basic Procedure of Manufacturing Process

FIG. 1 is a flow chart illustrating a management procedure for a sample evaluation and thin film manufacturing process according to an embodiment of the present invention.

First, in step ST101, assuming a case where a process (process P) of manufacturing 1 lot of 50 wafers is performed, the first wafer (an evaluation wafer) is measured by an evaluation method M (e.g., the spectroscopic ellipsometry method) to obtain actual measurement values of a physical amount (e.g., $\Delta$ and $\Psi$ spectra).

On the other hand, the initial estimated value of a process condition is set in step ST102, and a sample structure is estimated by a process simulator in step ST103, after which the theoretical estimated value of a physical amount measurement value is calculated in step ST104.

Then, in step ST105, the actual measurement value and the theoretical calculated value of the physical amount are compared with each other. In this step, an evaluation value used for evaluating the degree of difference between the actual measurement value and the theoretical estimated value is calculated.

Then, in step ST106, it is determined whether the evaluation value is a local minimum value. If the evaluation value is not a local minimum, the process returns to step ST103, after setting a new estimated value in step ST107, so as to repeat the operations of steps ST104 to ST106.

If it is determined in the determination of step ST106 that the evaluation value is a local minimum, the process proceeds to step ST108 to decide on the estimated value of the sample structure, after which it is determined whether the sample structure is within an appropriate range in step ST109. If it is determined as a result of the determination that the sample structure is within the appropriate range, the process proceeds to step ST110 to perform the next operation with the process conditions that have been set.

On the other hand, if it is determined as a result of the determination in step ST109 that the sample structure is not within the appropriate range, the process proceeds to step ST111 to correct those of the process conditions, which have been estimated in step ST108, that are deviated from the appropriate range, and process the wafers other than the evaluation wafer. Note that the evaluation wafer may also be processed again.

Description of Each Step of Flow Chart process described above will now be described specifically with respect to an example where a composition-graded SiGe-HBT structure is evaluated.

The measurement of the actual measurement values of a physical amount in step ST101 is performed by using an optical evaluation method. In the present embodiment, the spectroscopic ellipsometry method is used. The present invention can be carried out by alternatively using any other optical evaluation method such as the spectroscopic reflectance measuring method, for example. Particularly, it is preferred that the physical amount is such that with the wavelength of light being a variable, the variable can take a plurality of real numbers. This is because unless a plurality of actual measurement values are obtained, it is not possible to perform, with a high precision, a fitting operation between the actual measurement value and the estimated value using the least square method, or the like.

In the present embodiment, a sample having an epitaxially grown SiGe film is measured by the spectroscopic ellipsometer method to obtain $\Psi$ and $\Delta$ spectra for a plurality of wavelengths. The Ge composition percentage dependence of an optical constant of an SiGe film is significant in a short wavelength region. However, since light having a short wavelength is easily absorbed by Si, it is preferred to perform the measurement from the ultraviolet region to the visible light region for evaluating the profile of the Ge composition percentage.

Figure 2:
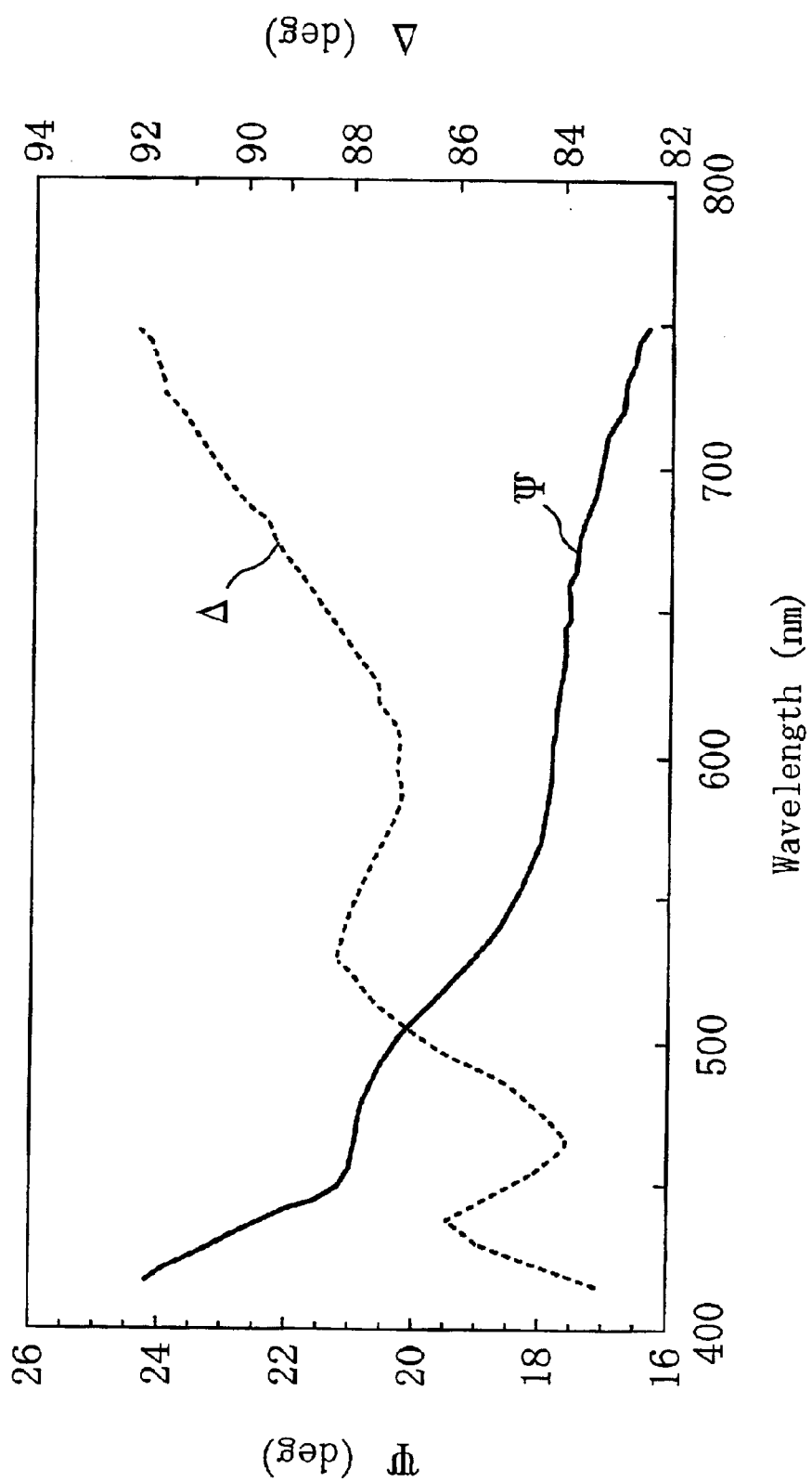
FIG. 2 is a diagram illustrating examples of $\Delta$ and $\Psi$ spectra obtained as a result of a measurement by a spectroscopic ellipsometry method.

FIG. 2 is a diagram illustrating examples of $\Delta$ and $\Psi$ spectra obtained as a result of a measurement by the spectroscopic ellipsometry method. As described above, where a component of reflected light, which is obtained by irradiating a spectrum sample with linearly-polarized light, whose electric field vector is parallel to the incident plane is denoted as a p-polarization component, another component whose electric field vector is perpendicular to the incident plane is denoted as an s-polarization component, and their complex reflectances are denoted by Rp and Rs, respectively, $\rho$=Rp/Rs is also a complex number. Therefore, $\rho$ can be expressed as $\rho$=tan $\Psi$ ei $\Delta$ using two real numbers $\Psi$ and $\Delta$. FIG. 2 shows spectra obtained by measuring the two physical amounts $\Psi$ and $\Delta$ for light of various wavelengths.

Then, in step ST102, initial values of process conditions are estimated. Herein, when setting the process conditions, three values, i.e., the substrate temperature, the flow rate of disilane, and that of germane, can be specified, whereby the growth rate and the Ge composition percentage are obtained. Thus, the substrate temperature and how to flow the gases are determined so as to obtain a desired trapezoidal profile of the Ge composition percentage such as in a layered film including a composition-graded SiGe film. Therefore, it is necessary to first set a desired Ge composition percentage profile structure, and to determine the process conditions under which the profile structure can be obtained.

FIG. 3(a) to FIG. 3(d) are diagrams respectively illustrating a designed Ge composition percentage profile in a layered film of a composition-graded SiGe-HBT, a profile in a case where the conditions are deviated, a profile for estimation of the conditions using a process simulator, and a profile of a corrected sample structure.

Figure 3A:
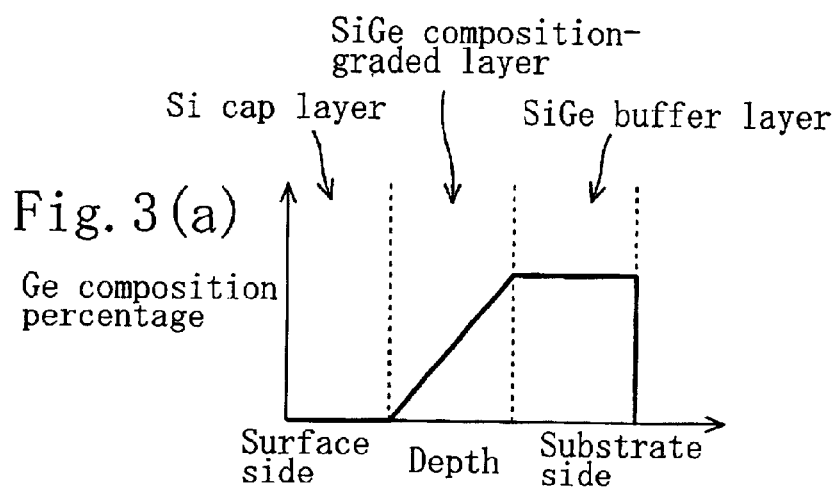
FIG. 3(a) to FIG. 3(d) are diagrams respectively illustrating a designed Ge composition percentage profile in a layered film of a composition-graded SiGe-HBT, a profile in a case where the conditions are deviated, a profile for estimation of the conditions using a process simulator, and a profile of a corrected sample structure.

As described above, in the case of a composition-graded SiGe-HBT, a trapezoidal Ge composition percentage profile is designed, as illustrated in FIG. 3(a), in order to generate an internal electric field in the base layer for accelerating the carrier. In the present embodiment, a layered film having a total thickness of 130 nm is epitaxially grown on an Si substrate, with the thickness of the SiGe buffer layer being 40 nm, the thickness of the SiGe composition-graded layer being 40 nm, and the thickness of the Si cap layer being 50 nm. The Ge composition percentage of the SiGe buffer layer is set to a uniform value of 15%. The Ge composition percentage of the SiGe composition-graded layer is set to 15% in a portion adjacent to the SiGe buffer layer and 0% in a portion adjacent to the Si cap layer, while the Ge composition percentage is varied approximately linearly (stepwise, strictly speaking) in the SiGe composition-graded layer.

Figure 4:
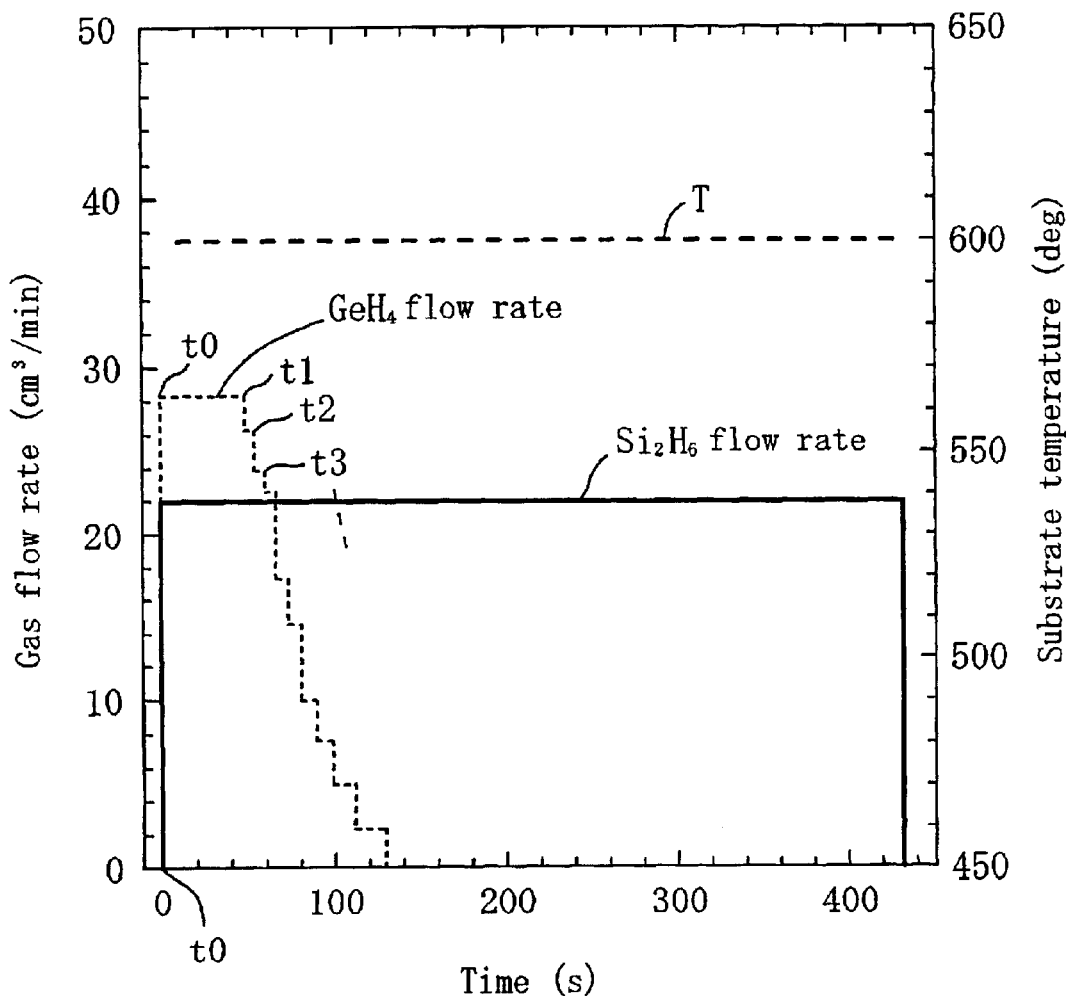
FIG. 4 is a diagram illustrating process conditions for obtaining a trapezoidal profile structure as illustrated in FIG. 3(a).

FIG. 4 is a diagram illustrating process conditions for obtaining a trapezoidal profile structure as illustrated in FIG. 3(a). Normally, in order to facilitate the control, the substrate temperature T is kept at a constant level and the flow rate of disilane ($Si_2H_6$) is kept at a constant level, while only the flow rate of germane ($GeH_4$) is modulated, during the growth, so as to control the flow rate ratio. In other words, the Ge composition percentage of the SiGe film is varied stepwise by reducing stepwise the flow rate of germane. At this time, although the Ge composition percentage can be decreased by decreasing the germane flow rate, the growth rate will also decrease. Therefore, the germane flow rate is modulated so as to realize a desired profile.

Figure 5:
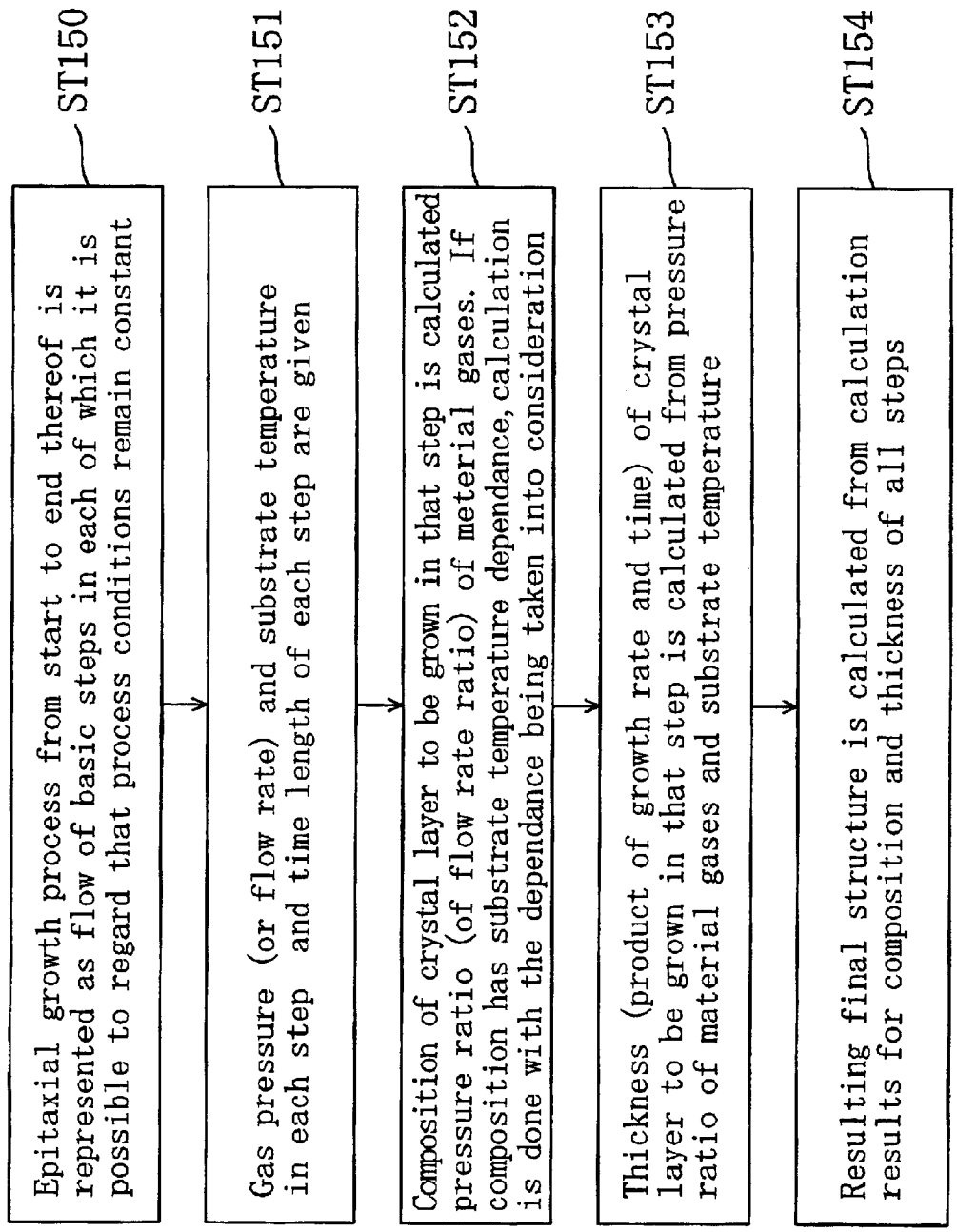
FIG. 5 is a flow chart illustrating a procedure of estimating a sample structure by a process simulator.

FIG. 5 is a flow chart illustrating a procedure of estimating a sample structure by a process simulator in step ST103.

First, in step ST150, the epitaxial growth process from the start to the end thereof is represented as a flow of basic steps in each of which it is possible to regard that the process conditions remain constant, and in step ST151, the gas pressure (or the flow rate) and the substrate temperature in each step and the time length of each step are given. Specifically, a plurality of basic steps are defined along the flow of process conditions as illustrated in FIG. 4, with the times t0, t1, t2, t3, . . . , at which the parameters of the process conditions (only the germane flow rate in this example) change, being boundaries.

Then, in step ST152, the composition (Ge composition percentage) of the crystal layer to be grown in that step is calculated from the pressure ratio (or the flow rate ratio) of the material gases. If the composition has a substrate temperature dependence, the calculation is done with the dependence being taken into consideration. This corresponds to obtaining the Ge composition percentage d(t) for each step based on Expression (2) above.

Then, in step ST152, the thickness (the product of the growth rate and time) of the crystal layer to be grown in that step is calculated from the pressures of the material gases and the substrate temperature, and in step ST154, the resulting final structure is calculated from the calculation results for the composition and the thickness of the layer of all steps.

Figure 6:
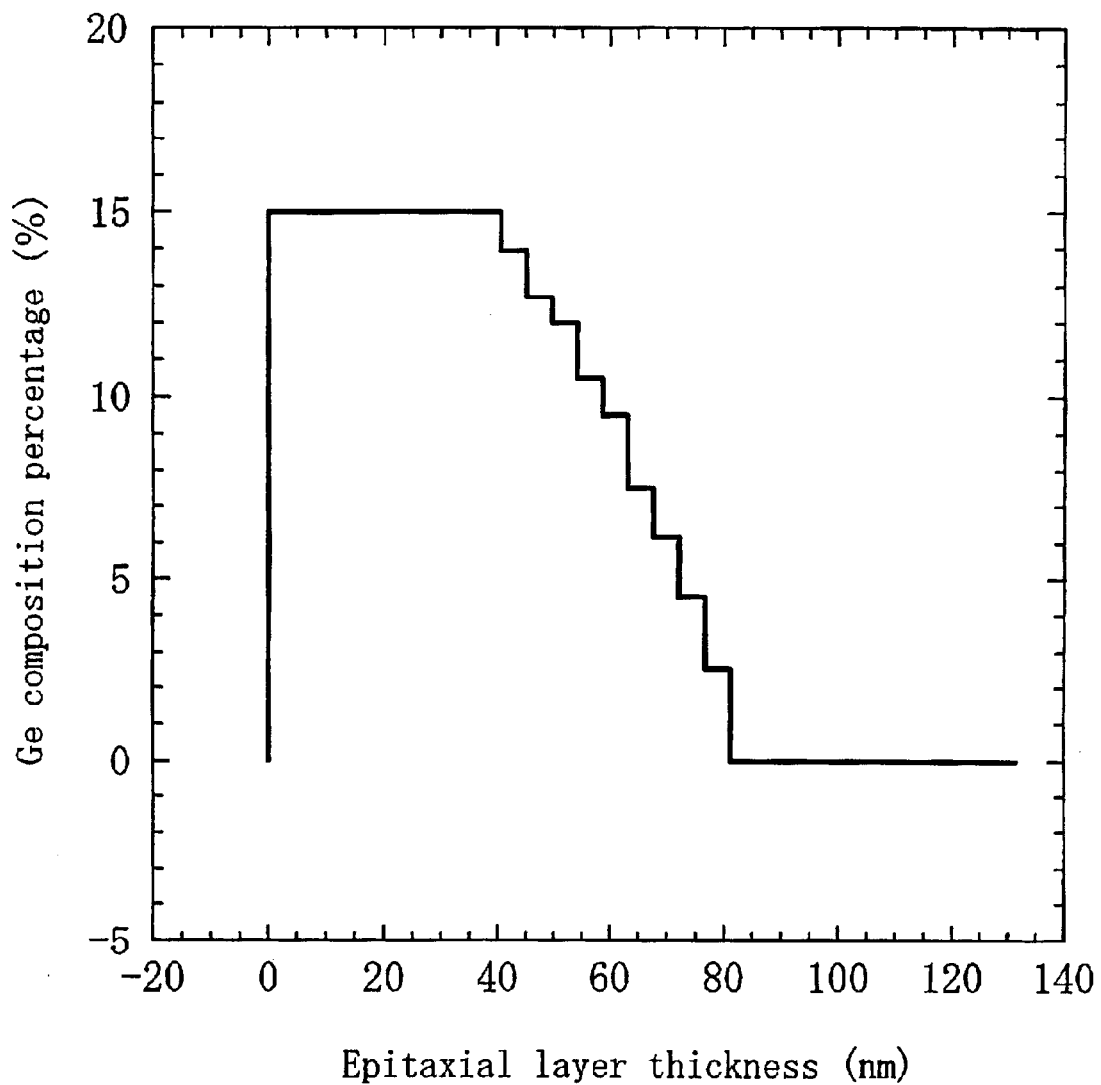
FIG. 6 is a diagram illustrating a profile of a Ge composition percentage in the thickness direction of an epitaxial layer that is estimated by a process simulator.

FIG. 6 is a diagram illustrating a profile of a Ge composition percentage in the thickness direction of an epitaxial layer that is estimated by a process simulator. It can be seen that the profile shown in the figure has a contour of a slightly upwardly protruding shape.

Figure 7:
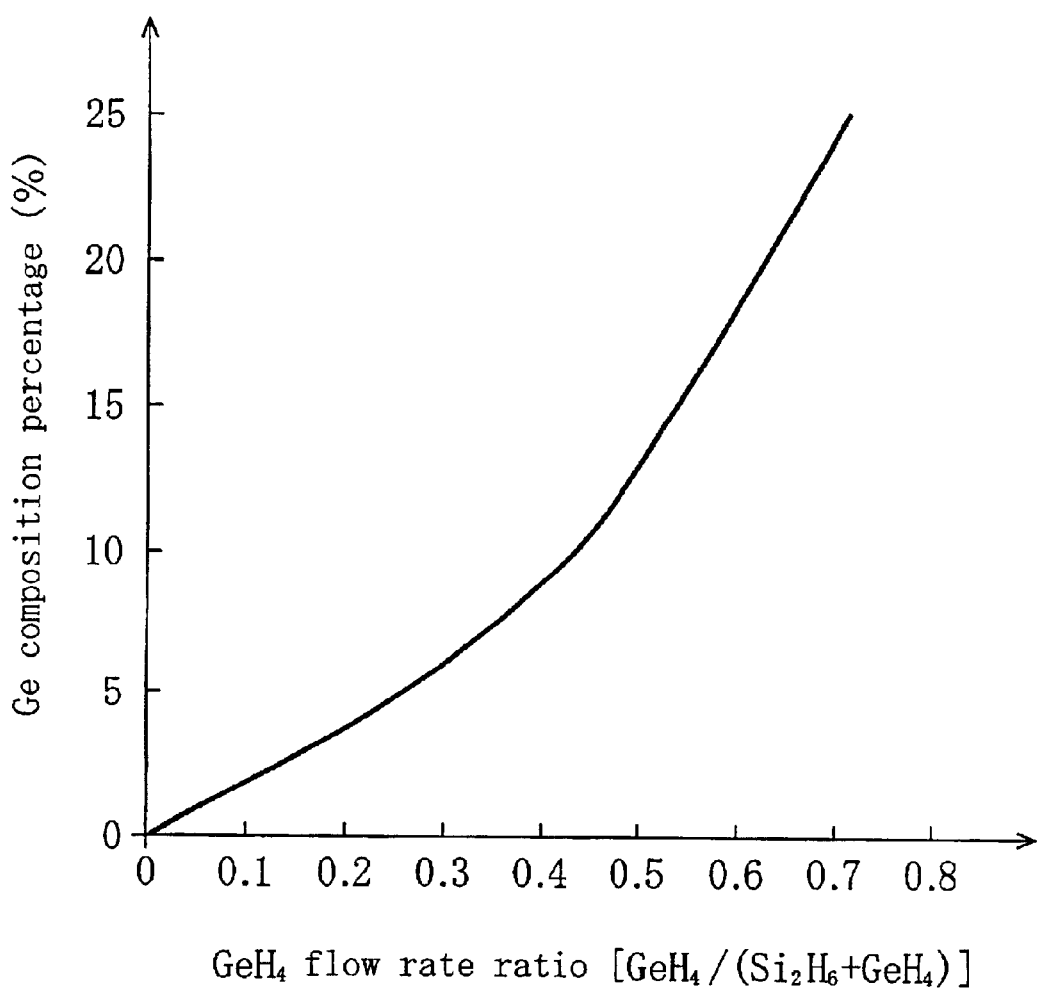
FIG. 7 is a diagram illustrating a germane flow rate ratio dependence of a Ge composition percentage in an SiGe layer.

FIG. 7 is a diagram illustrating a germane flow rate ratio dependence of a Ge composition percentage in an SiGe layer. The Ge flow rate ratio is the germane flow rate ratio with respect to the total flow rate of disilane ($Si_2H_6$) and germane ($GeH_4$). Note that the growth rate of the SiGe layer depends on the substrate temperature and the gas flow rate. In the case of the UHV-CVD method, the substrate temperature is relatively low, whereby a reaction rate-determining region is easily entered, where the growth rate no longer depends on the gas flow rate with the reaction on the substrate surface being unable to keep up with the flow of an amount of the material gas greater than a certain amount. A normal process is performed only in the reaction rate-determining region.

In the reaction rate-determining region, the temperature dependence of the growth rate is of a so-called "thermal activation process type", in which the reaction rate g and the temperature T have the following relationship:

$$g \propto \exp(-Ea/T*k)$$

where g denotes the growth rate, T denotes the substrate temperature, and Ea denotes the activation energy. Herein, k is the Boltzmann constant.

The epitaxial growth of the SiGe layer is characteristic in that the activation energy Ea has a Ge composition percentage dependence, where the value of the activation energy Ea decreases as the Ge composition percentage increases. As a result, at the same temperature, the growth rate of the SiGe layer increases as the Ge composition percentage increases, and the substrate temperature dependence of the growth rate decreases.

Figure 8:
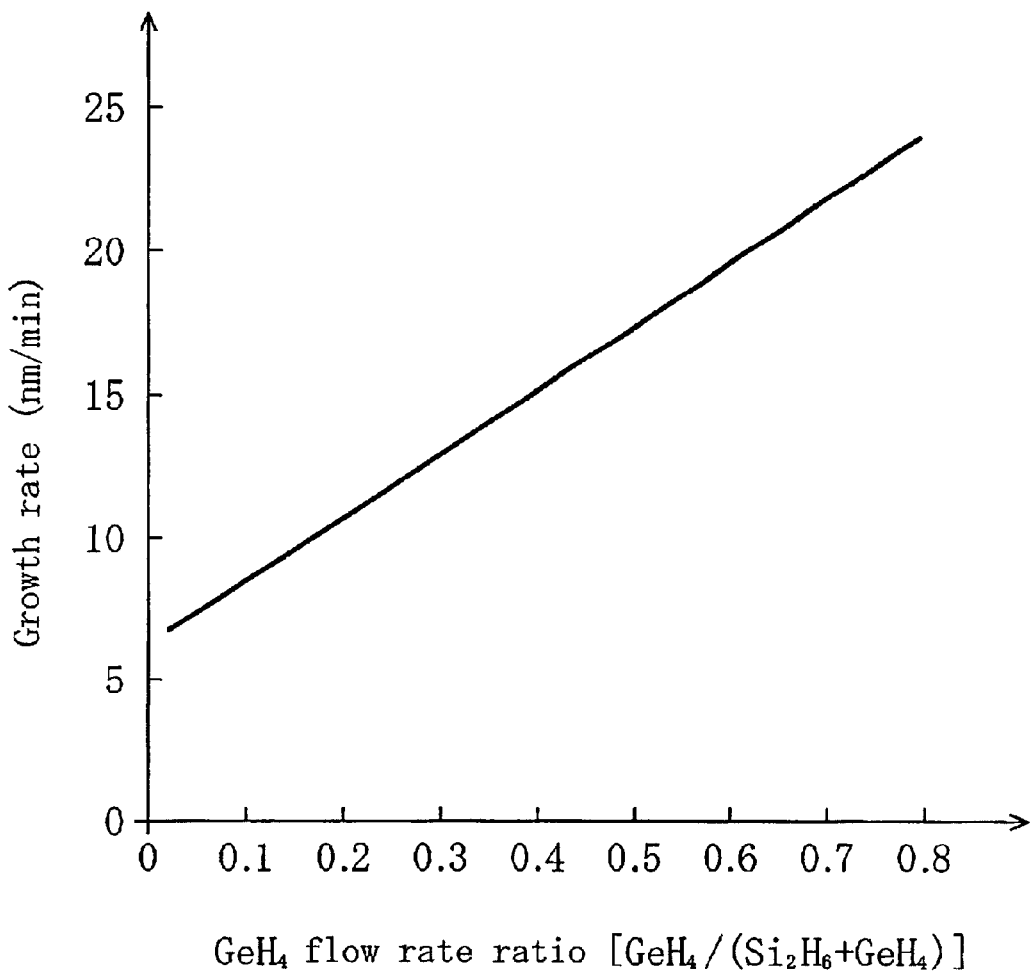
FIG. 8 is a diagram illustrating a germane flow rate ratio dependence of a growth rate of an SiGe layer.

FIG. 8 is a diagram illustrating a germane flow rate ratio dependence of the growth rate (nm/min) of the SiGe layer. FIG. 8 illustrates the relationship between the growth rate and the germane flow rate ratio at a substrate temperature of 587° C. As illustrated in the figure, the growth rate increases as the flow rate ratio of germane ($GeH_4$) increases. It has been found that at a temperature in the vicinity of 600° C., a change in the substrate temperature by 1° C. (1 degree) causes a change in the growth rate by about 3% in the case of an Si layer (the point at which the Ge flow rate ratio is 0), while it causes a change in the growth rate of only about 2% with an SiGe layer whose Ge composition percentage is 15%.

As described above, the resulting structure can be calculated by setting three process conditions, i.e., the substrate temperature, the disilane flow rate and the germane flow rate, and specifying values of these three amounts at any time in the film formation process. Note that if a process condition is deviated from the set condition in an actual process, it is rare that the gas flow rate is deviated from the set value, but in most cases, the substrate temperature is deviated from the set value. Moreover, it is rarely the case that the substrate temperature varies with time. Therefore, it is in many cases sufficient to set one variable with the substrate temperature being a variable from a constant value, as the structure estimation parameter. Of course, depending on the circumstances, there may be cases where the gas flow rate is deviated, or where the substrate temperature varies with time. In such cases, those values may also be employed as fitting parameters. Thus, a structure that can actually be produced can be all expressed by parameters by using a method of estimating a structure from the process conditions.

The method of estimating a structure from the process conditions may be a method as described above of specifying the relationship among a constant growth temperature, a constant gas flow rate ratio, a growth rate and a Ge composition percentage, and then calculating a structure under arbitrary growth conditions. Alternatively, the method may be a method of previously producing samples for a number of different process conditions, and obtaining the relationship between each resulting structure and the process condition value, so that sample structures produced under conditions other than those used for producing the samples can be obtained through interpolation. This method is convenient in cases where there are only a small number of process parameters.

Then, in step ST104, based on the Ge composition percentage profile structure illustrated in FIG. 8, Δ and Ψ spectra (the theoretical estimated values of the physical amounts), which would be obtained by optically evaluating a layered film having such a structure using the spectroscopic ellipsometry method, are calculated. Thus, the profile of an optical constant in the depth direction can be calculated according to the Ge composition percentage profile, and the theoretical estimated value of the measurement value of the layered film using the spectroscopic ellipsometry method or the spectroscopic reflectance measuring method can be calculated according to the optical constant profile.

The specific calculation method for the theoretical estimated value is described in detail in "Ellipsometry and Polarized Light (Elsevier Science Ltd Published 1987)" by Azzam et. al. The calculation principle is to assume that a sample is a layered film including a large number of layers in which the optical constants are constant in each layer, and to obtain the light propagation in each layer and the reflectance and the transmittance at each interface from the optical constants of the respective layers. Thus, if the relationship between the composition and the optical constants (refractive index n, extinction coefficient k) of each layer is known, it is possible to estimate the measurement value of a physical amount which would occur when optically evaluating the structure of the layered film, which has been estimated by a process simulator.

The relationship between the composition and the optical constants of SiGe or SiGeC is described in, for example, an article "R. T. Carline et. al. Appl. Phys. Lett. 64 No. 9 p. 1114–1116, 1994", and an algorithm for calculating optical constants from an arbitrary composition is described in, for example, an article "Snyder et. al. Appl. Phys. 68 No. 11 p. 5925–5926, 1990".

Therefore, a sample structure can be calculated by inputting process condition values to a process simulator, whereby the theoretical estimated value of the measurement value by the spectroscopic ellipsometry method, which is obtained from the sample structure, can be calculated.

Figure 9:
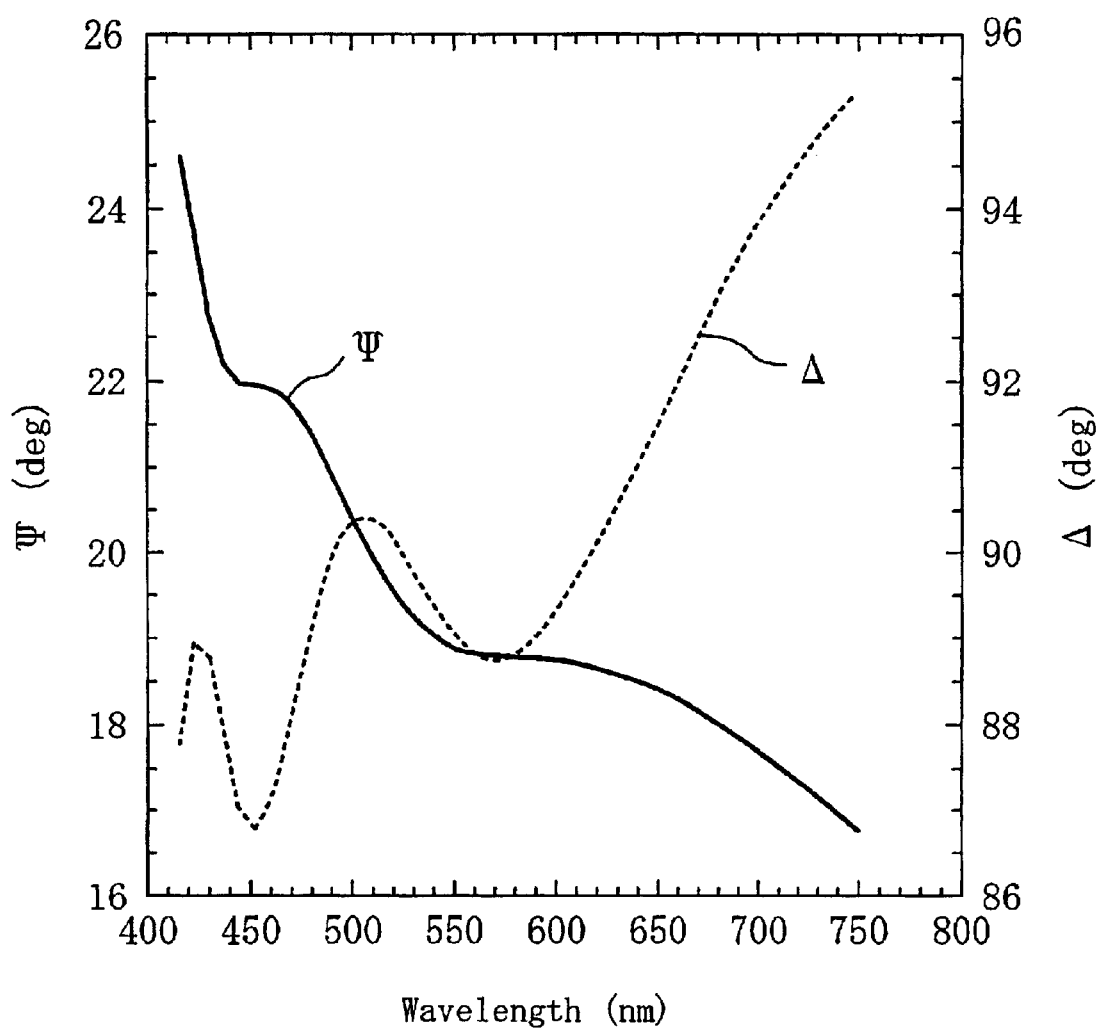
FIG. 9 shows $\Delta$ and $\Psi$ spectra simulated from a layered film having a Ge composition percentage profile as illustrated in FIG. 6.
Figure 10:
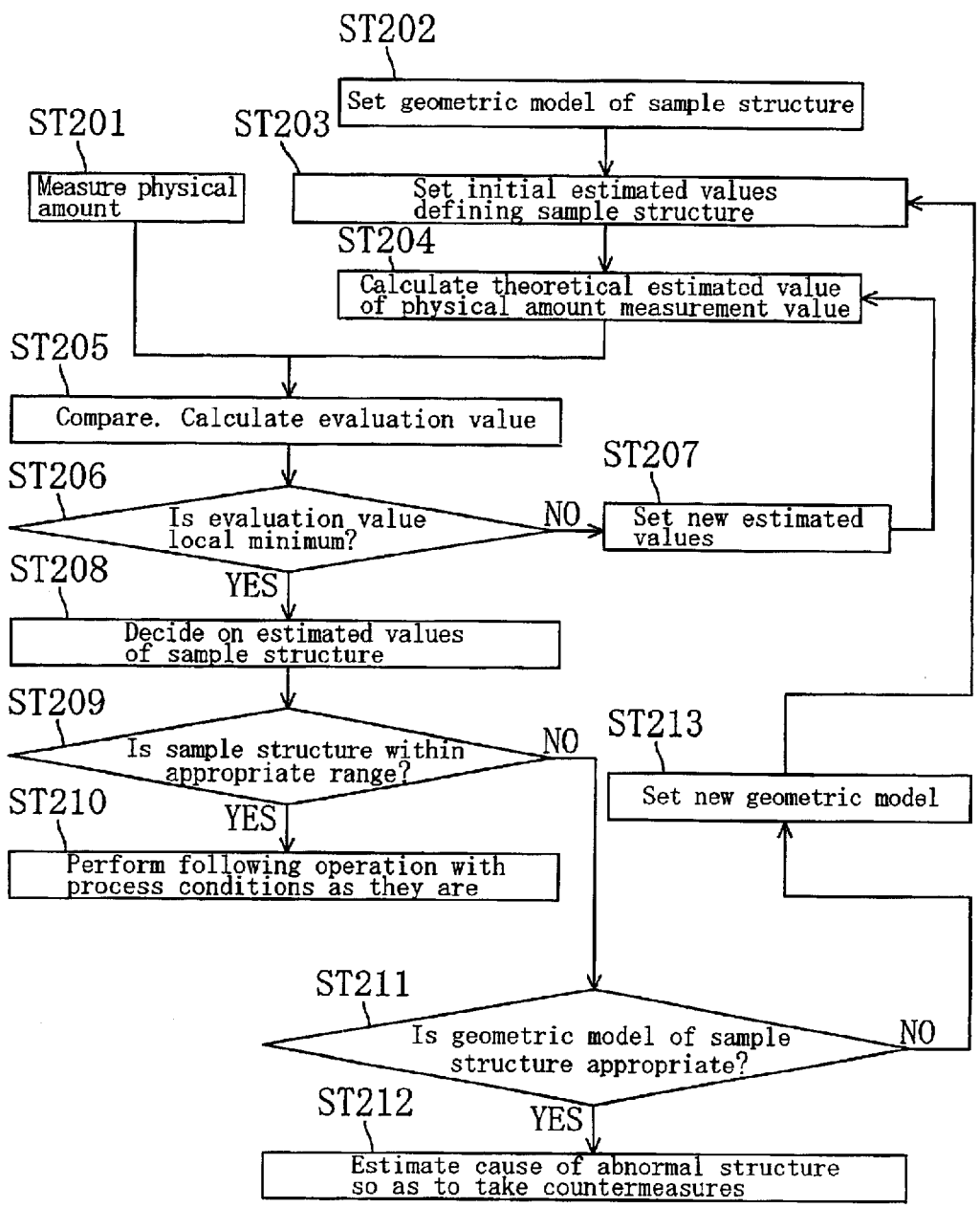
FIG. 10 is a flow chart illustrating a management procedure for a conventional sample evaluation and thin film manufacturing process.

FIG. 9 shows Δ and Ψ spectra (theoretical estimated values) simulated by the present inventors from a layered film having a Ge composition percentage profile as illustrated in FIG. 6. Note that the spectral simulation illustrated in FIG. 9 takes into consideration the apparatus constant inherent to the used ellipsometry spectroscopic apparatus. Therefore, when a layered film of the same structure is measured by using a different ellipsometry spectroscopic apparatus, the same spectra as those illustrated in FIG. 9 may not be obtained.

Then, in step ST105, the actual measurement value illustrated in FIG. 2 and the theoretical estimated value illustrated in FIG. 9 are compared with each other. The variance value σ shown in Expression (1), for example, is obtained as the evaluation value, and it is determined in step ST106 whether or not the evaluation value is a local minimum. Until the evaluation value is a local minimum, the operations are repeated by returning from step ST107 to step ST103. In the operation of step ST107, a process condition, which is obtained by varying only the substrate temperature T from 600° C. as illustrated in FIG. 4 by only 1° C., for example, is set as a new estimated value, and the estimation of the sample structure in step ST103 is performed based on the process condition.

Since the three amounts, i.e., the substrate temperature, the disilane flow rate and the germane flow rate, are set as the process conditions, it is possible also in step ST107 to set new values of these three amounts at any time in the film formation process. However, it is in most cases the substrate temperature T among other process conditions that deviates from the setting value in an actual process, as described above. Therefore, in this example, only one variable, i.e., the substrate temperature T, is used as the parameter for structure estimation.

In a case where the simulated annealing is used, the value of the substrate temperature T is corrected in a direction in which there seems to be the greatest probability for the evaluation value to reach a local minimum, in the operation of step ST107, based on the differential coefficient of the evaluation value when the substrate temperature T is varied, whereby the evaluation value converges at a local minimum.

Then, in step ST108, the most probable process condition estimated value is obtained based on the physical amounts obtained in step ST101 (the Δ and Ψ spectra illustrated in FIG. 2). Then, if it is determined in the determination of step ST109 that the process condition is deviated from the appropriate range (e.g., 600° C.±0.5° C.), the condition is corrected in step ST111. Thus, it is determined whether or not to correct the process condition at the point where the process proceeds from step ST109 to either ST110 or ST111.

For example, when it is estimated that the actual measurement value of the physical amount illustrated in FIG. 2 is a value obtained from a layered film that is epitaxially grown under a condition where the substrate temperature T is lower than 600° C. by 2° C., the parameter defining the substrate temperature T is changed so that the substrate temperature T is increased by 2° C. before processing the subsequent wafers. In this way, an appropriate countermeasure can be taken against an abnormal cause, whereby it is possible to form a structure having a desired profile from the next time on.

Effects of Embodiment

Figure 11A:
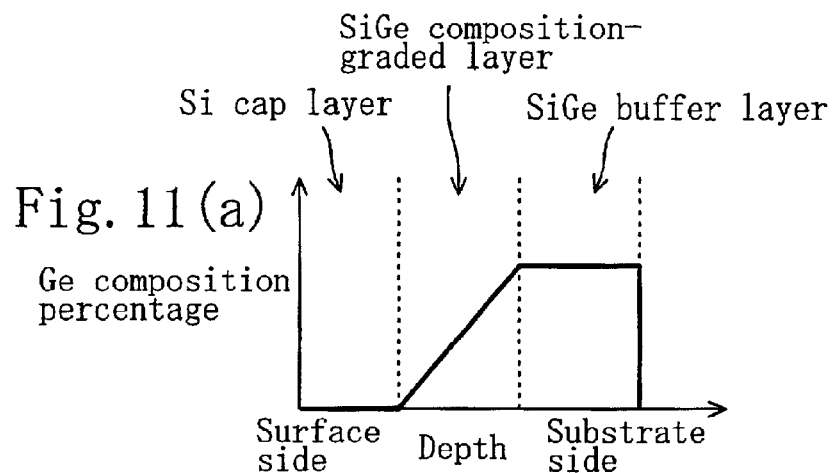
FIG. 11(a) to FIG. 11(d) are diagrams respectively illustrating a designed Ge composition percentage profile in a layered film of a composition-graded SiGe-HBT, a profile in a case where the conditions are deviated, a conventional estimated profile assuming a uniform structure, and a profile of a corrected sample structure.
Figure 11B:
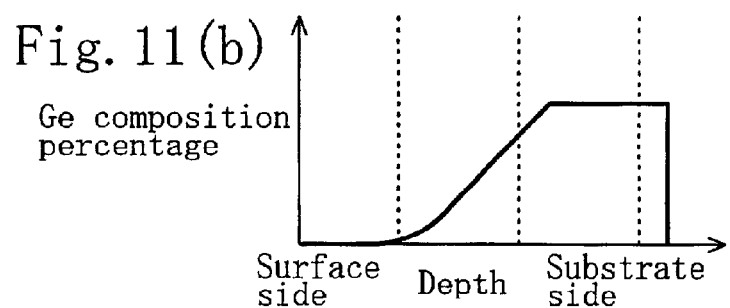
Figure 11C:
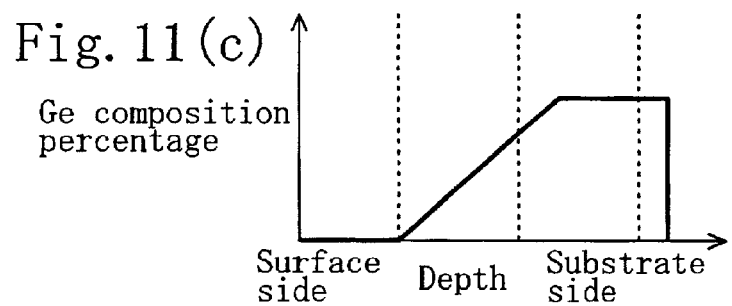
Figure 11D:
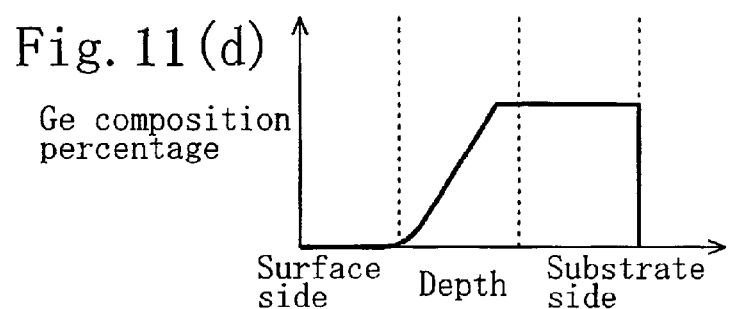

In an actual crystal growth process for producing a transistor, an insulative film, a polysilicon layer, etc., have already been formed in the substrate before the crystal growth. In the case of such a substrate having a pattern already formed therein, the same temperature may not be obtained when it is heated in the same manner as is an Si substrate with no pattern formed therein, due to a difference in the thermal radiation factor, etc. Moreover, the growth temperature may vary even for substrates having the same type of pattern, due to process variations in the thickness of the insulative film layer. Therefore, it is often the case that a sample that actually needs to be evaluated is a sample, which has been formed with a deviated temperature and which has a curve portion in the Ge composition percentage profile. Moreover, it is very difficult to have a substrate temperature that is uniform across the surface thereof, thereby resulting in portions having been formed with different temperatures across the substrate surface. In such a case, according to the conventional method, the theoretical estimated value of the measurement value of the physical amount, which is obtained by the spectroscopic ellipsometry method, or the like, is estimated, while assuming such a structure that a layered film would not actually have, as that illustrated in FIG. 11(c). Therefore, as illustrated in FIG. 11(d), only a physical structure (e.g., the Ge composition percentage profile structure) that is deviated from the designed structure can be obtained.

In contrast, according to the present embodiment, a structure that can actually occur is estimated so as to grasp that the temperature is deviated from the standard condition, thereby allowing the condition to be corrected based on such knowledge, as is shown below.

Figure 3B:
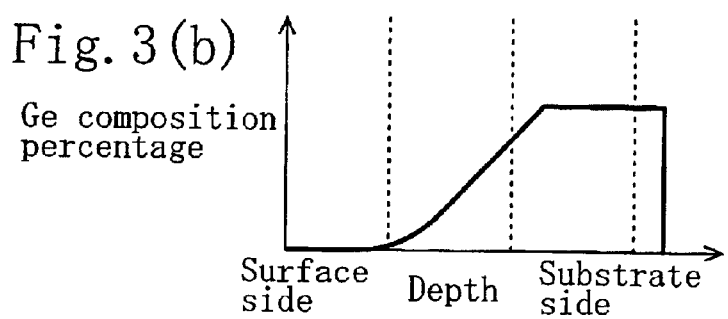

For example, in a case where the process conditions are set with the trapezoidal profile structure illustrated in FIG. 3(a) being used as the design value, thereby resulting in a profile structure as illustrated in FIG. 3(b), the most probable profile structure that the layered film would actually have is obtained while repeating the operations from step ST103 to ST106 after returning from step ST107 to step ST103.

Figure 3C:
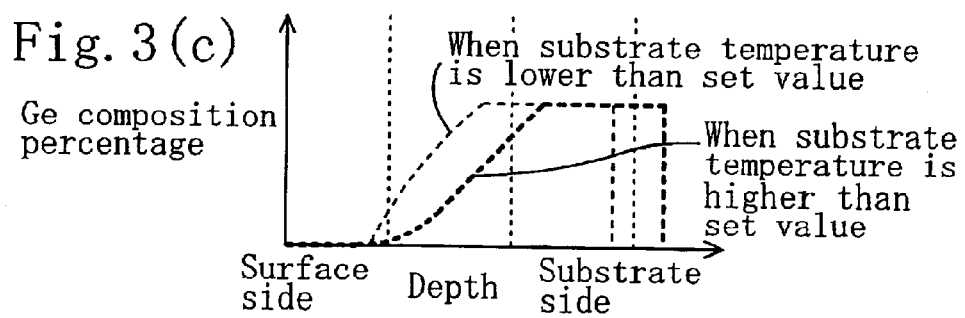
Figure 3D:
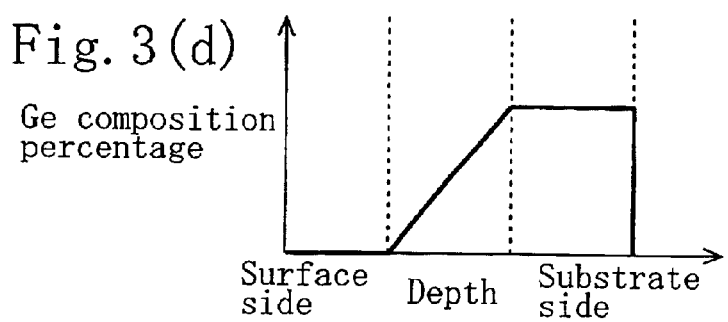

Thus, as illustrated in FIG. 3(c), information on the composition and thickness of each layer in the layered film (the SiGe buffer layer, the SiGe composition-graded layer, and the Si cap layer) is obtained, including information on whether it has an upwardly protruding shape as that occurring when the substrate temperature T is higher than the set value or a downwardly protruding shape as that occurring when the substrate temperature T is lower than the set value. Then, the process condition is corrected based on the information, whereby it is possible to form a layered film having a trapezoidal profile that is substantially as designed, as illustrated in FIG. 3(d), in the subsequent processes.

In other words, in the present embodiment, the theoretical estimated value of the measurement value of the physical amount by the spectroscopic ellipsometry method is estimated based on a profile structure that the layered film would actually have. As a result, it is possible to obtain a structure as designed (a trapezoidal profile structure of the Ge composition percentage in this example).

Thus, it is possible to improve the characteristics of a semiconductor device and to reduce the variations in the characteristics thereof.

Other Embodiments

Basically, an algorithm of a conventional method can be used as the algorithm for calculating the evaluation value, and an evaluation value other than the variance value as shown in Expression (1) can be used. Alternatively, any other existing algorithm for determining a local minimum value can be used, instead of the simulated annealing, as the local minimum value determination algorithm.

Moreover, the determination operation of step ST109 may be replaced by a determination on whether or not the estimated value of the device structure (the Ge composition percentage profile structure) is within an acceptable range.

Furthermore, a communication function may be provided between the evaluation apparatus and the manufacturing apparatus for performing the film formation operation, so that the following process can be corrected automatically based on the evaluation results. This is particularly effective when employing a system such that the evaluation apparatus and the manufacturing apparatus are accommodated in a common casing.

Such a fitting procedure of performing the structure estimation through process simulation and the comparison between a theoretical estimated value of a physical amount and an actual measurement value can be performed by an apparatus separate from an apparatus for measuring the actual measurement value of the physical amount. However, it is preferred that a computer having therein a hard disk storing an algorithm for performing the fitting procedure is installed in the measuring equipment, in which case operations from the measurement of physical amounts to the final sample structure estimation can be performed in an integrated manner.

Moreover, the operations shown in the flow chart of FIG. 1 can be performed automatically by recording the procedure thereof in a recording medium. For example, by recording the procedure of step ST102 to step ST107 as a program in a computer-readable recording medium, it is possible to automatically estimate the process conditions under which a structure to be controlled has been formed. For example, the recording medium may be any of a CD-ROM, a magnetic tape and an FD using a magnetic material, a non-volatile memory such as an EEPROM, a DVD, etc.

When carrying out the present invention, it is not necessary to use a process simulator for all portions of a sample structure. For example, in the case of a composition-graded HBT structure, it is in some cases more convenient to directly use the thickness and the composition percentage as parameters, as in the prior art, for any portion that is a film of a uniform composition, such as the SiGe buffer layer portion and the Si cap layer, while using a process simulator only for the SiGe composition-graded layer. In such a case, it is still possible to appropriately express the profile of the SiGe composition-graded layer, as compared to the conventional method, whereby the evaluation precision is considerably improved from that of the conventional method.

In the embodiment described above, an SiGe composition-graded HBT structure is produced by the UHV-CVD method and is evaluated by the spectroscopic ellipsometry method. However, the present invention is not limited to this combination. For example, since the spectroscopic reflectance measuring method and the spectroscopic ellipsometry method have many things in common, the procedure illustrated in the flow chart of FIG. 1 can be performed substantially in the same manner only by changing the physical amounts which are to be actually measured and for which theoretical estimated values are to be calculated from $\Psi$ and $\Delta$ to reflectance. The present invention can be carried out with any other evaluation method as long as it is possible to estimate a sample structure and to calculate a theoretical estimated value of a physical amount.

Moreover, the present invention can be carried out with any process other than the UHV-CVD method as long as it is a process such that the relationship between a process condition and a structure that would be formed by using the process condition is clear, while it is possible to develop a process simulator therefor. For example, the present invention can be carried out easily with an epitaxial growth process by an LP-CVD method or an MBE method, or the like. Moreover, an RTA process for impurity diffusion and activation and silicide formation is a suitable method with which the present invention is carried out because in the RTA process, the process condition is controlled by a very small number of parameters such as the temperature and the time while the structure to be formed has a very complicated profile.

Even for a film having a simple structure, such as an oxide film or a nitride film, the process improving effect can be obtained by employing the present invention because even for such a film, process condition values to be corrected are easily obtained by the method of the present invention.

Nevertheless, it is particularly significant to use the present invention with those which are made of a plurality of elements and which have a structure whose composition varies therethrough. With such a structure, it is often the case that when the composition varies, the growth condition (e.g., the growth rate) varies accordingly, whereby it is difficult with the conventional method to accurately grasp the structure or to accurately correct a condition. In contrast, by finding a physical amount (structure) that can actually occur when a process condition is varied, based on which a measurement value of the physical amount is then estimated, as in the present invention, it is possible to control, substantially as designed, the structure of a film that varies in a complicated manner. For example, such a film made of a plurality of elements may be a compound semiconductor film such as an SiGe crystal film, an SiGeC crystal film, an AlGaAs crystal film, an $Si_yC_{1-y}$ film, or an InP film. The present invention can be used with any of such semiconductor films.

INDUSTRIAL APPLICABILITY

The structure evaluation method, the method for manufacturing a semiconductor device, and the recording medium of the present invention can be used for a bipolar transistor or an MESFET to be provided in electronic devices, particularly a hetero-junction bipolar transistor.

What is claimed is:

1. A method for manufacturing a semiconductor device, comprising the steps of:

(a) obtaining a plurality of actual measurement values of a physical amount of an element of a semiconductor device by an optical evaluation method for one evaluation wafer of a plurality of wafers each including the element;

(b) assuming a process condition for forming the element of the evaluation wafer, and obtaining through calculation a structure of the element that is formed through a process using the assumed process condition;

(c) calculating estimated values of a plurality of measurement values of a physical amount that are obtained when evaluating the structure of the element, which has been obtained in the step (b), by the optical evaluation method;

(d) estimating the structure of the element based on the plurality of actual measurement values of the physical amount of the element of the evaluation wafer and the estimated values of the plurality of measurement values; and (e) if a difference between the estimated structure of the element of the evaluation wafer and a designed structure of the plurality of wafers is not within an acceptable range, correcting the process condition of the process at least for wafers of the plurality of wafers other than the evaluation wafer.

2. The method for manufacturing a semiconductor device of claim 1, wherein the process is an epitaxial growth process of a crystal film.

3. The method for manufacturing a semiconductor device of claim 2, wherein the crystal film is a crystal film containing a plurality of elements.

4. The method for manufacturing a semiconductor device of claim 3, wherein the crystal film is a crystal film including a structure which contains Si and Ge and whose band gap varies in a graded manner.

* * * * *

UNITED STATES PATENT AND TRADEMARK OFFICE
CERTIFICATE OF CORRECTION

PATENT NO. : 6,720,587 B2
DATED : April 13, 2004
INVENTOR(S) : Nozawa, Katsuya et al.

It is certified that error appears in the above-identified patent and that said Letters Patent is hereby corrected as shown below:

Title page,
Item [56], References Cited, OTHER PUBLICATIONS, change
"PCT/US01/05161" to -- PCT/JP01/05161 --

Signed and Sealed this

Fourteenth Day of December, 2004

JON W. DUDAS
*Director of the United States Patent and Trademark Office*